United States Patent [19]

Hatchett et al.

[11] 4,378,509

[45] Mar. 29, 1983

[54] LINEARIZED DIGITAL PHASE AND FREQUENCY DETECTOR

[75] Inventors: John D. Hatchett, Scottsdale, Ariz.; Andrew S. Olesin, Austin, Tex.

[73] Assignee: Motorola, Inc., Schaumburg, Ill.

[21] Appl. No.: 168,817

[22] Filed: Jul. 10, 1980

[51] Int. Cl.³ .................. H03K 5/26; H03D 13/00
[52] U.S. Cl. .................. 307/528; 307/526; 307/514; 331/1 A; 328/133
[58] Field of Search .................. 328/133, 134, 55, 155; 307/514, 525, 526, 528, 511, 516, 527; 331/1 A

[56] References Cited

U.S. PATENT DOCUMENTS

| | | | |
|---|---|---|---|
| 3,710,140 | 1/1973 | Volmerange | 328/133 |
| 3,714,463 | 1/1973 | Laune | 307/525 |
| 3,750,035 | 7/1973 | Crow | 328/133 |
| 3,792,362 | 2/1974 | Grant | 328/55 |
| 4,027,262 | 5/1977 | Sharpe | 328/133 |
| 4,297,274 | 9/1981 | Suzuki et al. | 328/133 |
| 4,322,643 | 3/1982 | Presler | 328/133 |

Primary Examiner—John S. Heyman
Attorney, Agent, or Firm—Joe E. Barbee

[57] ABSTRACT

A digital phase and frequency detector is capable of providing a linearized transfer function. The digital phase and frequency detector includes two latches each receiving an input and each providing an output. The output of the latches is combined by a logic gate to generate a reset signal. The linearization is a result of providing a delay to the reset signal. The reset signal is used to reset the two latches within the phase and frequency comparator. This improved phase and frequency comparator eliminates non-linearities which would otherwise be inherent in its transfer function and thereby degrade performance of phase-locked systems employing the comparator. The phase and frequency detector is easily manufactured as an integrated circuit and does not require any external signals in order to eliminate the non-linear region.

10 Claims, 4 Drawing Figures

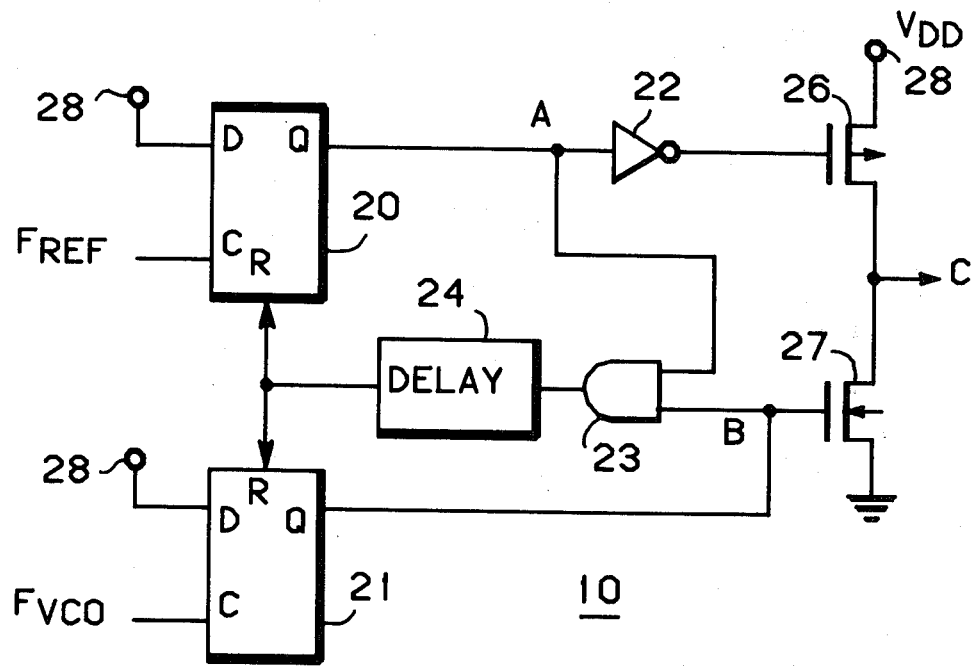

LINEARIZED DIGITAL PHASE AND FREQUENCY DETECTOR

This invention relates, in general, to phase and frequency detectors, and more particularly, to a linearized digital phase and frequency detector useful in a phase-locked loop synthesizer.

A basic phase-locked loop includes a phase and frequency detector. There are a number of digital phase and frequency detector systems but the most widely used type generates an error signal by comparing the edges of two waveforms. The ideal phase detector will always give an appropriate output even for every small changes in phase between the two waveforms. If leakage currents exist, the detector will supply either narrow pump-up or pump-down pulses to the loop filter to compensate for the leakage. Leakage can occur at both the loop filter and at the output circuit of the phase detector.

In the past, however, digital frequency and phase detectors have had problems with a non-linear region in their transfer function extending from a few to several nanoseconds about the lock point. Because of the stringent requirements of the phase-locked loop voltage controlled oscillator, this non-linear region becomes very important. Instead of the voltage controlled oscillator having a clean peaked spectral output, the non-linear problems result in system design compromises which cause the voltage controlled oscillator to exhibit a somewhat broader and degraded spectral output.

One attempt to eliminate the non-linear problems in frequency and phase detectors has been to add additional circuitry to the detector so that a narrow pulse could be injected into the system. The phase-locked loop would then automatically compensate by making another error pulse of equal and opposite magnitude. Both errors were closely related in time and could be easily filtered out by small filter capacitors. This solution requires additional circuitry in order to generate the narrow pulse which is to be injected in addition to the additional circuitry required within the loop in order to receive the narrow pulse.

Accordingly, it is an object of the present invention to provide an improved digital phase and frequency detector which exhibits substantially linear operation when the loop is locked.

Yet another object of the present invention is to provide a frequency and phase detector or comparator which uses a delay means in order to achieve linear operation.

SUMMARY OF THE INVENTION

In achieving the above and other objects of the present invention there is provided, in one form, a frequency and phase detector or comparator useful in a digital phase-locked loop synthesizer which exhibits substantially linear operation. The digital phase and frequency detector includes first and second resettable storage means for temporarily storing a logic level. Means for generating a reset pulse are used to generate a reset pulse from the output of the first and second resettable storage means. And delay means are provided in series between the means for generating the reset pulse and the first and second resettable storage means to provide a delay in the reset pulse reaching the first and second storage means.

DETAILED DESCRIPTION OF THE DRAWINGS

Figure 1:
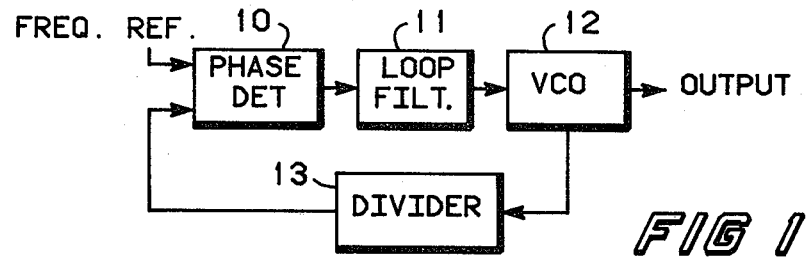
FIG. 1 is a block diagram of a basic phase-locked loop system.

The basic phase-locked loop system illustrated in FIG. 1 is shown having four circuits. The first circuit is the phase detector 10 having two inputs and providing an output. One input is a reference frequency and the other input is an output from divider 13. The output of phase detector 10 goes to a loop filter 11 which provides a filtered output to voltage controlled oscillator 12. Voltage controlled oscillator 12 provides a phase-locked loop system output and also provides an output which is coupled to divider 13. Divider 13 is an integer frequency divider and should ideally have minimum switching noise to avoid effecting the power supplies or causing electromagnetic radiation that would create problems in associated circuitry. Voltage controlled oscillator 12 should have excellent stability, exhibit low noise, and have a predictable voltage-to-frequency curve. Loop filter 11 should have minimum leakage current and very low noise. If leakage currents exist, phase detector 10 will have to supply either narrow pump-up or pump-down error pulses to loop filter 11 to compensate for the leakage.

Figure 2:
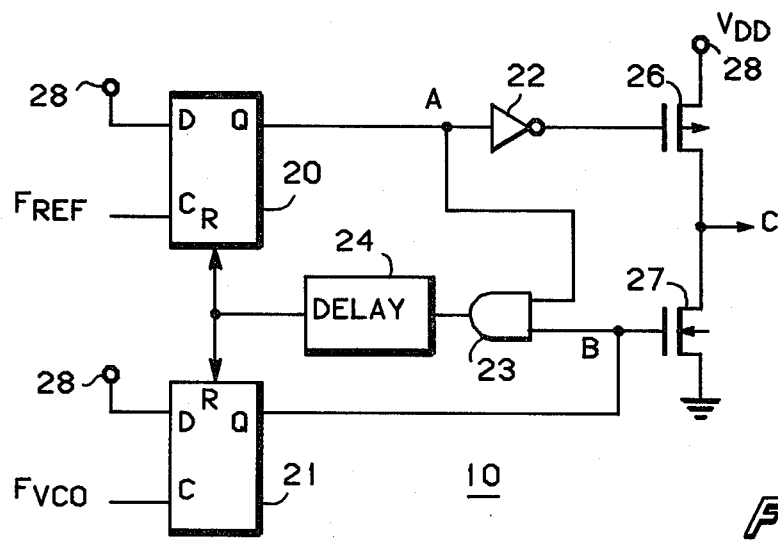
FIG. 2 is a simplified block diagram of a phase detector having the present invention.

The output frequency of voltage controlled oscillator 12 is divided down by divider 13 and then fed into phase detector 10 where the frequency and phase are compared against a reference frequency. Frequency and phase detector 10 (as illustrated in FIG. 2) can provide three different outputs commonly referred to as a three-state output. These outputs are a very high impedance, a pump-up, or pump-down pulse to loop filter 11. Loop filter 11 provides a feedback control voltage to voltage controlled oscillator 12. When the phase-locked loop is locked and operating at the desired frequency, the two frequencies fed into phase detector 10 are the same and are essentially the same phase. Under these conditions, phase detector 10 supplies only sufficient output to maintain loop lock. When the loop is not locked, the two signals at the input of phase detector 10 differ in frequency or phase, and phase detector 10 then supplies an output of sufficient magnitude and proper direction to loop filter 11 to generate a voltage that will drive voltage controlled oscillator 12 to a frequency that will cause the loop to lock.

Accordingly, phase detector 10 is a phase and frequency comparator detecting the difference in frequency and phase to provide the proper output to maintain the loop in a locked condition.

FIG. 2 illustrates, in simplified form, circuitry useful as phase detector 10 which eliminates non-linear problems. Phase detector 10 is a digital phase detector having latches or flip-flops 20 and 21. Flip-flop 20 has one input which is connected to voltage terminal 28 to receive voltage $V_{DD}$, and a clock input which receives the reference frequency, $F_{REF}$. The Q output of flip-flop 20 goes to node A which is coupled to the input of inverter 22 and to an input of AND gate 23. The output of inverter 22 is coupled to the gate electrode of P-channel field effect transistor 26. Transistor 26 is coupled in series with N-channel field effect transistor 27 between voltage terminal $V_{DD}$ and a voltage reference terminal illustrated as ground. An output node C is formed between transistors 26 and 27. Flip-flop 21 has an input connected to power supply $V_{DD}$ at terminal 28. The clock input of flip-flop 21 receives the divided down frequency, $F_{VCO}$, from the loop frequency divider. The Q output from flip-flop 21 is coupled to node B which is connected to an input of AND gate 23 and to the gate electrode of transistor 27. The output of AND gate 23 goes to a delay circuit 24 which provides a delayed output for the reset input of flip-flops 20 and 21. Delay circuit 24 provides a delay to the reset pulse which results in eliminating the non-linearity associated with the phase and frequency detector.

The comparison of the waveforms of the reference frequency and the voltage controlled oscillator frequency is done by phase detector 10. Comparator or phase detector 10 uses flip-flops 20 and 21 as latches or temporary storage means. A delaying circuit 24 is used to delay reset pulses to the latches resulting in linearized operation. The output of latches 20 and 21 are used to control transistors 26 and 27 so that output C will be a high when transistor 26 is enabled, or substantially ground when transistor 27 is enabled. When neither transistors 26 or 27 are enabled output C will be a high impedance output. Phase detector 10 is readily manufactured in integrated circuit form. Delay 24 eliminates the non-linear region without requiring additional signals which may cause transients and cross coupling problems. In a preferred embodiment, delay 24 will provide sufficient delay to allow the pulses at nodes A and B to just reach their maximum amplitude when signals $F_{REF}$ and $F_{VCO}$ are identical in phase and frequency, e.g. when the phase-locked loop is locked. It should be noted that the present invention can be used in those phase detectors employing four flip-flops or latches as well as those employing two as illustrated.

Figure 3:
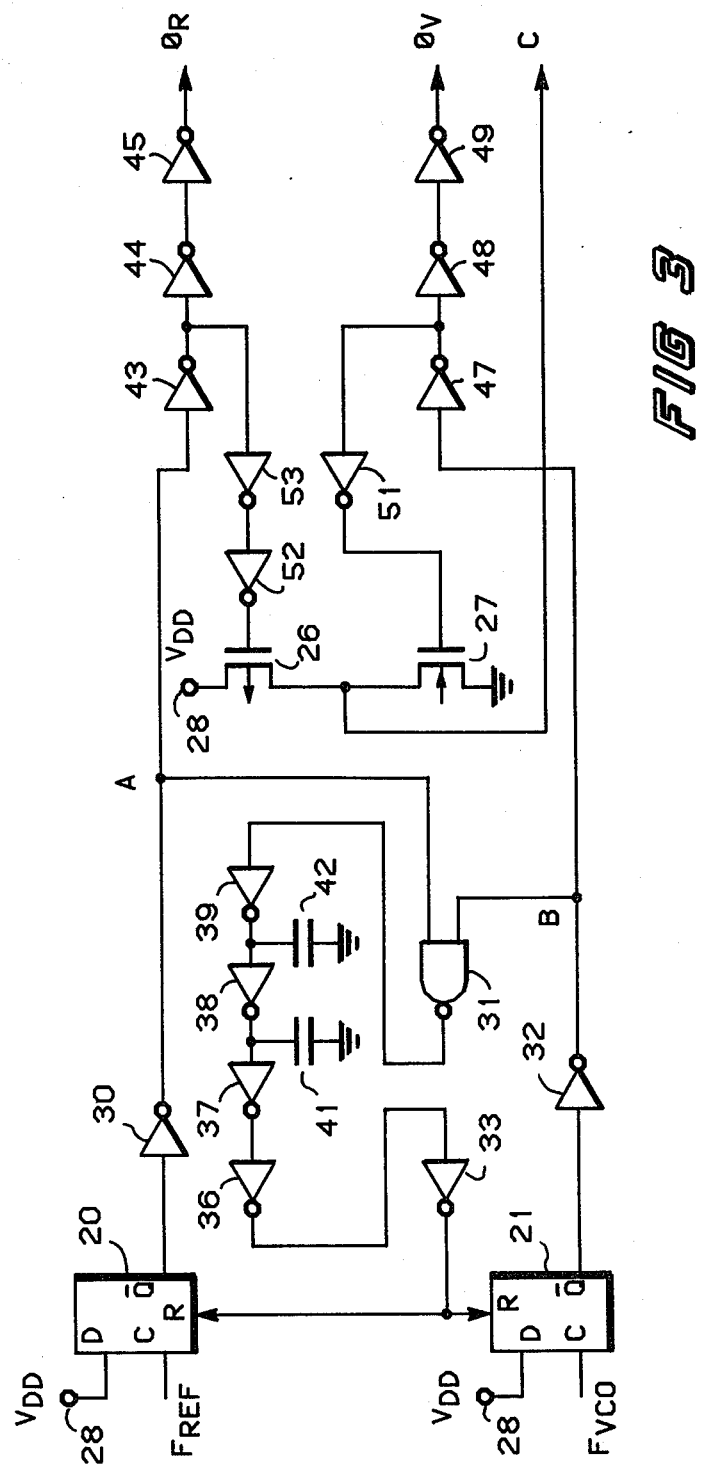
FIG. 3 is a more detailed logic diagram of a phase detector having the present invention.

FIG. 3 illustrates, in greater detail, a phase and frequency comparator or detector using the present invention. All the elements which are the same as the elements of FIG. 2 have the same reference numeral. The digital phase detector of FIG. 3 also has two latches or flip-flops 20 and 21. Flip-flop 20 has an input connected to terminal 28 to receive power supply voltage $V_{DD}$. Its clock input receives the reference frequency $F_{REF}$. The $\overline{Q}$ output of flip-flop 20 is coupled by inverter 30 to node A. Node A is coupled to inverter 43 and to an input of a logic gate illustrated as NAND gate 31. Flip-flop 21 has an input connected to voltage terminal 28 to receive power supply voltage $V_{DD}$ and receives the divided down voltage controlled oscillator frequency, $F_{VCO}$, on its clock input. The $\overline{Q}$ output of flip-flop 21 is coupled by inverter 32 to node B which is also coupled to inverter 47 and to an input of NAND gate 31. The output of NAND gate 31 is delayed by a series of inverters 36, 37, 38 and 39. These inverters provide the delay for the reset signal which is coupled from inverter 36 by inverter 33 to the reset inputs of flip-flops 20 and 21. The delay can be adjusted by adding more or less inverters as desired. Although inverter 33 also adds a slight delay, its main purpose is to provide the correct polarity reset input for flip-flops 20 and 21. A capacitor 41 is coupled from the output of inverter 38 to ground and a capacitor 42 is coupled from the output of inverter 39 to ground. Capacitors 41 and 42 may be used to supply additional delay, if needed. By using capacitors 41 and 42 the total delay may tend to be less process dependent. The size of capacitors 41 and 42 can be of the order of one (1) picofarad.

The output of inverter 43 is coupled to inverter 44 and to inverter 53. The output of inverter 44 is coupled by inverter 45 to an output terminal to provide an output error signal designated $\emptyset_R$. The output of inverter 47 is coupled by inverters 48 and 49 to another output terminal to provide another error signal designated $\emptyset_V$. The output of inverter 47 is also coupled by inverter 51 to transistor 27. The output of inverter 53 is coupled by inverter 52 to the gate or control electrode of transistor 26. The output of inverter 45 and the output of inverter 49 provide a double-ended error signal output which can be used by the loop filter. A single-ended output is obtained from the node between transistors 26 and 27 and is labeled output C. Typically one or the other output is used; that is either the double-ended error signal output is used or else the single-ended three-state error signal is used.

Inverter 43 is used to invert the signal from node A to P-channel transistor 26. Inverters 44 and 45 are connected in series and provide buffering. By using two inverters in series, buffering is achieved without inversion. Inverters 47, 48 and 49 are used to balance the effects of inverters 43, 44 and 45. Inverter 51 is used to provide some balance for the effects of inverters 52 and 53.

Figure 4:
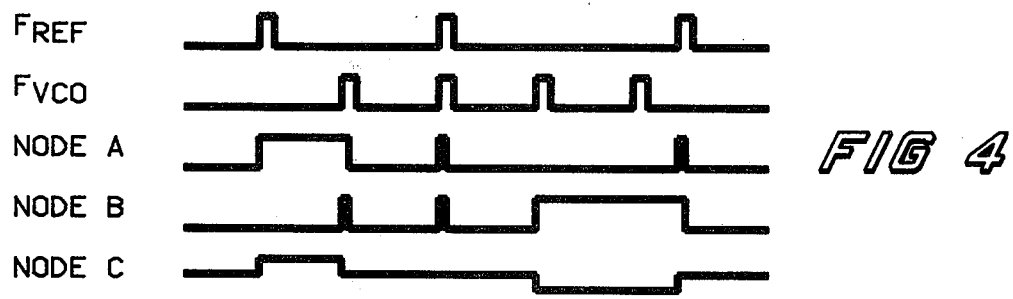
FIG. 4 shows some timing waveforms useful in understanding the operation of the phase detector.

FIG. 4 illustrates the timing relationship of some of the signals used in the circuits of FIG. 2 and FIG. 3. The top waveform, $F_{REF}$, is the input for latch 20 and the second waveform, $F_{VCO}$, is the input for latch 21. The bottom three waveforms represent the signals at nodes A, B, and C, respectively. A locked loop is illustrated at the phase coincidence of signals $F_{REF}$ and $F_{VCO}$ which causes minimum width pulses to be generated at nodes A and B. It will be understood that the delay inserted in the reset pulse signal path should be of sufficient length to allow the pulses at nodes A and B to reach their maximum amplitude but yet not cause these pulses to be excessively wide. Merely as an example, a delay of approximately 100 nanoseconds may be sufficient in most cases.

By now it should be appreciated that there has been provided an improved digital phase and frequency detector which is free of non-linearities in its transfer function and which is easily manufactured in integrated circuit form. This improved digital phase and frequency comparator does not require additional signals in order to achieve linearity.

I claim:
1. A phase and frequency detector for use in phase locked loop systems, the phase and frequency detector being of the type having a first and a second flip-flop, comprising:
a first input coupled to the first flip-flop; a second input coupled to the second flip-flop wherein the first flip-flop provides a first output and the second flip-flop provides a second output; a logic gate having a first input and a second input coupled respectively to the first and second outputs and providing an output; and means for providing a signal delay coupled to the output of the logic gate, the means also having an output coupled to the first and second flip-flops to provide a reset for the flip-flops.

2. The phase and frequency detector of claim 1 further including an inverter coupled to the first flip-flop to provide inversion for the first output.

3. The phase and frequency detector of claim 1 further including a first means for buffering coupled to the first output and a second means for buffering coupled to the second output.

4. The phase and frequency detector of claim 3 further including a first and a second transistor connected in series and providing an output from a junction formed between the transistors, each of the transistors having a control electrode, the control electrode of the first transistor being coupled to the first output, and the control electrode of the second transistor being coupled to the second output.

5. A phase-locked loop system having a digital phase and frequency comparator, the digital phase and frequency comparator comprising:

a first flip-flop having an input, an output and a reset input; a second flip-flop having an input, an output and a reset input; a logic gate having a first and a second input and an output, the first input of the logic gate being coupled to the output of the first flip-flop and the second input of the logic gate being coupled to the output of the second flip-flop; and means for providing a delay coupled between the output of the logic gate and the reset inputs for the first and second flip-flops.

6. The phase locked loop system of claim 5 wherein the means for providing a delay is a series of inverters.

7. The phase-locked loop system of claim 5 further including means for providing a single-ended output from the digital phase and frequency comparator comprising a first and a second transistor connected in series and providing the single-ended output from therebetween, each of the transistors having a control electrode wherein the control electrode of the first transistor is coupled to the output of the first flip-flop and the control electrode of the second transistor is coupled to the output of the second flip-flop.

8. A digital phase and frequency comparator, comprising: a first and a second resettable storage means each having an input for receiving inputs to be compared, an output and a reset input; means for generating a reset pulse from the output of the first and second resettable storage means, the means for generating having inputs coupled to the first and second resettable storage means and providing an output; and means for providing a delay coupled between the output of the means for generating and the reset input for the first and second resettable storage means.

9. The digital phase and frequency comparator of claim 8 wherein the first and second resettable storage means are each a flip-flop.

10. The digital phase and frequency comparator of claim 8 further including means for combining the outputs of the first and second resettable storage means to provide a single-ended output.

* * * * *